US005546274A

United States Patent [19]

Davidson

[11] Patent Number: 5,546,274
[45] Date of Patent: Aug. 13, 1996

[54] THREE-DIMENSIONAL COMPACT ARRAY OF ELECTRONIC CIRCUITRY

[75] Inventor: Howard L. Davidson, San Calos, Calif.

[73] Assignee: Sun Microsystems, Inc., Mountain View, Calif.

[21] Appl. No.: 401,964

[22] Filed: Mar. 10, 1995

[51] Int. Cl.[6] ................................... A05K 7/20
[52] U.S. Cl. .................. 361/701; 257/724; 361/716; 361/735
[58] Field of Search ................................. 257/706, 707, 257/712–714, 723, 724, 725; 62/259.2; 165/80.3, 80.4, 185, 104.33; 361/688–690, 699, 701, 702, 704, 707, 715, 716–718, 722, 724, 729, 730, 735, 749, 761, 764, 778, 789, 790; 174/15.1, 16.3, 252; 439/65–68, 70, 71, 77

[56] References Cited

U.S. PATENT DOCUMENTS

| | | | |
|---|---|---|---|
| 4,730,232 | 3/1988 | Lindberg | 361/688 |
| 4,956,746 | 9/1990 | Gates, Jr. | 361/385 |
| 5,053,856 | 10/1991 | Davidson | 357/82 |
| 5,065,277 | 11/1991 | Davidson | 361/383 |
| 5,079,619 | 1/1992 | Davidson | 357/81 |
| 5,208,794 | 5/1993 | Cipolla | 361/690 |
| 5,241,450 | 8/1993 | Bernhardt | 361/689 |

OTHER PUBLICATIONS

Narayan, et al, "Thin Film Transfer Process for Low Cost MCM–D Fabrication", Proceeding of the 1994 International Conference on Multichip Modules, pp. 105–111, Apr. 13–15, 1994, Denver, Colorado.

*Primary Examiner*—Gerald P. Tolin
*Attorney, Agent, or Firm*—Flehr, Hohbach, Test, Albritton & Herbert

[57] ABSTRACT

A three-dimensional compact array of electronic circuitry includes a plurality of stacked modular compact arrays of electronic circuitry. Each modular compact array of electronic circuitry includes a substrate-less multi-chip module supporting a number of integrated circuits and interconnect which electrically connects the integrated circuits. Each modular compact array of electronic circuitry further includes an integrated heat exchanger and stacking connector supporting the substrate-less multi-chip module. The integrated heat exchanger and stacking connector includes a transverse connector region including a plurality of connector vias for connection to the interconnect of the substrate-less multi-chip module, and a transverse flow region including channels for circulating a coolant to remove heat from the substrate-less multi-chip module.

8 Claims, 7 Drawing Sheets

THREE-DIMENSIONAL COMPACT ARRAY OF ELECTRONIC CIRCUITRY

BRIEF DESCRIPTION OF THE INVENTION

This invention relates generally to the packaging of semiconductors into multi-chip modules. More particularly, this invention relates to multi-chip modules that are incorporated into modular compact arrays which are then combined to form three-dimensional compact arrays of electronic circuitry.

BACKGROUND OF THE INVENTION

The assignee of the present invention is the assignee of a set of patents describing three dimensional packaging arrangements for computer systems. The present invention is an improvement upon the prior art described in those patents. The patents of interest include U.S. Pat. Nos. 5,065,277, 5,053,856, and 5,079,619, each of which is expressly incorporated by reference herein.

U.S. Pat. No. 5,065,277 discloses a three dimensional arrangement for packaging planar arrays of circuit components. Each planar array includes a multi-chip module supported by a substrate. The multi-chip module includes a set of integrated circuits supported by an insulator that also supports metal interconnect used to electrically connect the integrated circuits. Typically, the insulator is formed of polyimide and the interconnect is formed of copper. The multi-chip module is positioned on a substrate. The substrate includes vias which extend from the first planar surface of the substrate, through the substrate, to the second planar surface of the substrate. The vias on the first planar surface of the substrate are used for electrical connection to the metal interconnect of the multi-chip module.

In the prior art, this combination of a multi-chip module and a substrate is positioned within a shell. The shell includes connecting vias to electrically connect to the vias of the second planar surface of the substrate. In this configuration, the connecting vias of the shell can be used for electrical connection to another similarly configured module. Namely, the connecting vias can be electrically connected to a second multi-chip module and substrate which itself is positioned within a shell. As explained in U.S. Pat. No. 5,065,277, such a configuration can be used to form a computer system that includes sixteen processors and 0.5 gigabytes of random access memory in a volume approximately four inches by four inches by one inch.

Different devices for cooling the apparatus of U.S. Pat. No. 5,065,277 are described in U.S. Pat. Nos. 5,079,619 and 5,053,856. The operation of the cooling devices is inherently limited in view of the fact that the cooling devices are positioned against the multi-chip module substrate. As a result, heat generated on the multi-chip module must first migrate through the multi-chip module substrate and then be removed by the cooling devices.

It would be highly desirable to improve the high density electronic packages of U.S. Pat. Nos. 5,065,277, 5,053,856, and 5,079,619 by further reducing the size of the packages to facilitate improved component density, by reducing their cost, and by improving their thermal performance.

SUMMARY OF THE INVENTION

The apparatus of the invention is a three-dimensional compact array of electronic circuitry which includes a plurality of stacked modular compact arrays of electronic circuitry. Each modular compact array of electronic circuitry includes a substrate-less multi-chip module supporting a number of integrated circuits and interconnect which electrically connects the integrated circuits. Each modular compact array of electronic circuitry further includes an integrated heat exchanger and stacking connector supporting the substrate-less multi-chip module. The integrated heat exchanger and stacking connector includes a transverse via region including a plurality of connector vias for connection to the interconnect of the substrate-less multi-chip module, and a transverse flow region including channels for circulating a coolant to remove heat from the substrate-less multi-chip module.

The method of the invention includes the step of forming a multi-chip module on a substrate, wherein the multi-chip module includes a plurality of integrated circuits and interconnect which electrically connects the plurality of integrated circuits. The multi-chip module is then removed from the substrate to yield a substrate-less multi-chip module. The substrate-less multi-chip module is then attached to an integrated heat exchanger and stacking connector to form a modular compact array of electronic circuitry. The integrated heat exchanger and stacking connector includes a transverse via region with a set of connector vias for connection to the interconnect, and a transverse flow region including channels for circulating a coolant to remove heat from the substrate-less multi-chip module. The modular compact arrays of electronic circuitry are then combined to form a three-dimensional compact array of electronic circuitry.

Prior art structures of this type include substrate-bearing multi-chip modules. By removing the substrate, the substrate-less multi-chip module of the invention can be used to form a modular compact array of electronic circuitry. The modular compact array of electronic circuitry has reduced volume thereby permitting increased component density, it is less expensive because the substrate, typically ceramic, is omitted, and it has better heat transfer characteristics since the heat exchanger can be positioned in direct contact with the substrate-less multi-chip module.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
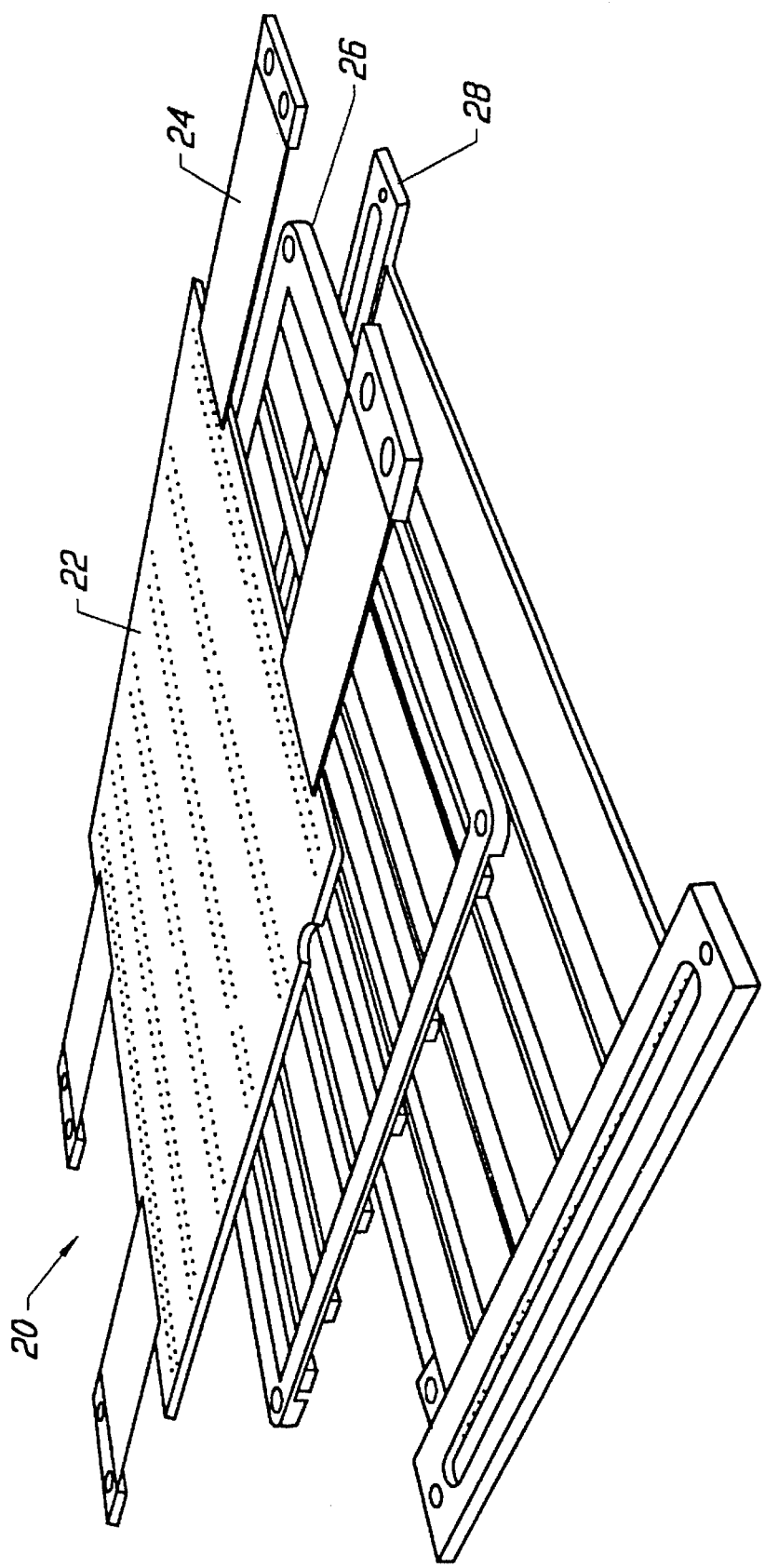
FIG. 1 is a perspective view of a modular compact array of electronic circuitry in accordance with one embodiment of the invention.

FIG. 1 is a perspective view of a modular compact array of electronic circuitry (also called a modular array) 20 in accordance with the invention. The modular array 20 includes a substrate-less multi-chip module 22. As used herein, the term substrate-less multi-chip module 22 refers to a multi-chip module 22 that does not include the substrate upon which it is originally fabricated. In other words, the multi-chip module 22 is treated as a discrete unitary component (consisting of an insulator, integrated circuits, and interconnect between the integrated circuits) during the construction of a modular array 20.

The process for forming a substrate-less multi-chip module 22 is as follows. A set of integrated circuits are attached to a flat fabrication substrate. Thereafter, they are encapsulated in an insulator, typically a polymer, such as polyimide. Known processing steps are then used to develop interconnect. The interconnect is a set of metal paths that electrically connect the different integrated circuits of the multi-chip module.

In accordance with the invention, the substrate is removed at this point in the processing. One known method for accomplishing this is to use a fused quartz fabrication substrate that is transparent in the ultraviolet. After the multi-chip module is constructed, the fabrication substrate is illuminated from below by an eximer laser. The ultraviolet light from the laser photoablates a thin layer of the polymer at the interface of the polymer and the quartz. This releases the film of circuitry from the quartz fabrication substrate in a non-destructive manner to yield a substrate-less multi-chip module. This technique is described in *"Thin Film Transfer Process For Low Cost: MCM-D Fabrication"*, Narayan, et al., *Proceedings of the* 1994 *International Conference on Multichip Modules,* pp. 105–111, Apr. 13–15, 1994, Denver, Colo., which is expressly incorporated by reference herein.

At this juncture, the previously buried bottom surface of the substrate-less multi-chip module can be processed to form vias to the signal, power, and ground portions of the interconnect. Pads can then be formed on the vias. The processing steps used on the top surface of the substrate-less multi-chip module can be used to accomplish this result. At this point, the substrate-less multi-chip module has pads on both its top surface and its bottom surface.

Returning now to FIG. 1, the substrate-less multi-chip module 22 is attached to a stacking connector 26 and heat exchanger 28. As will be described below, in a preferable embodiment, the stacking connector 26 and the heat exchanger 28 are formed as a unitary structure. However, for the purpose of illustration, they are depicted in FIG. 1 and several other figures as discrete components.

The substrate-less multi-chip module 22 is physically attached to the stacking connector 26 and heat exchanger 28 with an adhesive. The adhesive is preferably applied to the entire bottom surface of the multi-chip module 22, except for the interconnect pads. The adhesive may be applied using a pre-punched sheet of transfer adhesive, by silk screening, or by other methods known to those skilled in the art.

Figure 2:
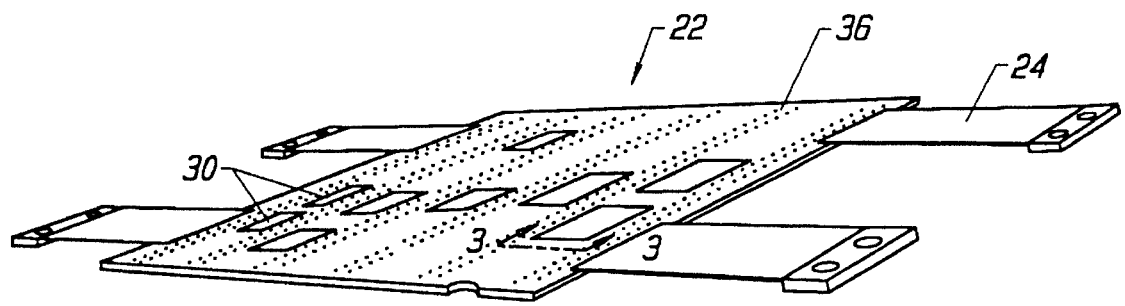
FIG. 2 is a perspective view of a substrate-less multi-chip module utilized in accordance with the invention.

FIG. 2 is an enlarged perspective view of the substrate-less multi-chip module 22 used in conjunction with the invention. The substrate-less multi-chip module 22 includes a set of integrated circuits 30. FIG. 2 also illustrates a set of top layer connecting pads 36. Finally, FIG. 2 illustrates power feed straps 24. The power feed straps 24 are metal foil conductors used to provide power and ground connections. Multiconductor flexible printed wire boards can be attached in a similar fashion to provide signal input/output.

Figure 3:
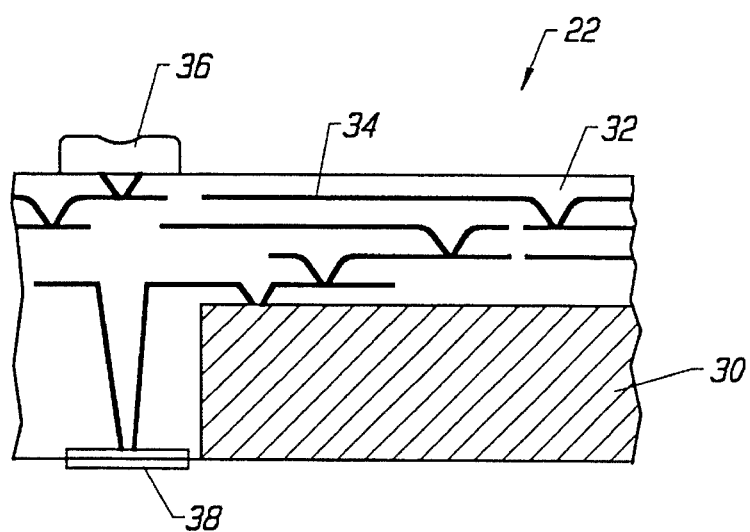
FIG. 3 is a cross-sectional view of a portion of the substrate-less multi-chip module of FIG. 2, taken along the line 3—3.

FIG. 3 is a cross-sectional view of a portion of the apparatus of FIG. 2, namely that portion of FIG. 2 marked by the line 3—3. FIG. 3 illustrates a portion of an integrated circuit 30. The integrated circuit 30 is positioned within an insulator 32 (typically a polymer such as polyimide). The insulator 32 supports a set of interconnect 34. As known in the art, the interconnect 34 is used to electrically connect different integrated circuits 30 of a multi-chip module. FIG. 3 also illustrates a top layer connecting pad 36 and a bottom layer connecting pad 38. The top layer connecting pad 36 is formed in accordance with known techniques. The bottom layer connecting pad 36 is also formed in accordance with known techniques, after the multi-chip module is removed from its fabrication substrate, as described above.

Figure 4:
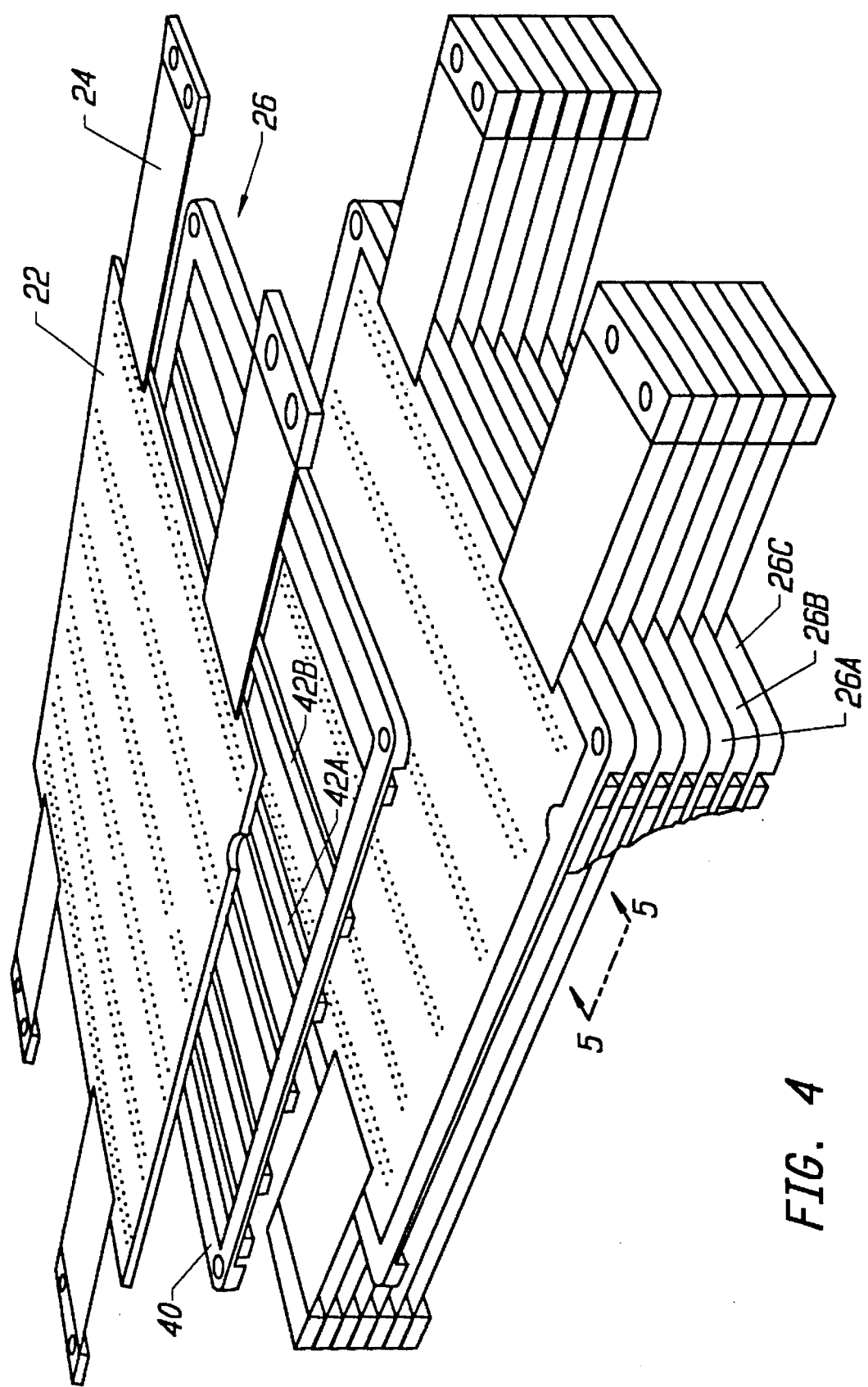
FIG. 4 is a perspective view of a set of stacking connectors in accordance with one embodiment of the invention.

FIG. 4 is a perspective view of a set of substrate-less multi-chip modules 22 and stacking connectors 26. In this figure it can be appreciated that each stacking connector 26 includes a stacking connector frame 40 which supports a set of stacking connector transverse members 42. Each stacking connector transverse member 42 includes a set of connector vias that are used to electrically connect bottom layer connecting pads 38 of a first substrate-less multi-chip module to top layer connecting pads 36 of a second substrate-less multi-chip module positioned beneath the stacking connector 26 associated with the first substrate-less multi-chip module. This connectivity is more fully appreciated with reference to FIG. 5.

Figure 5:
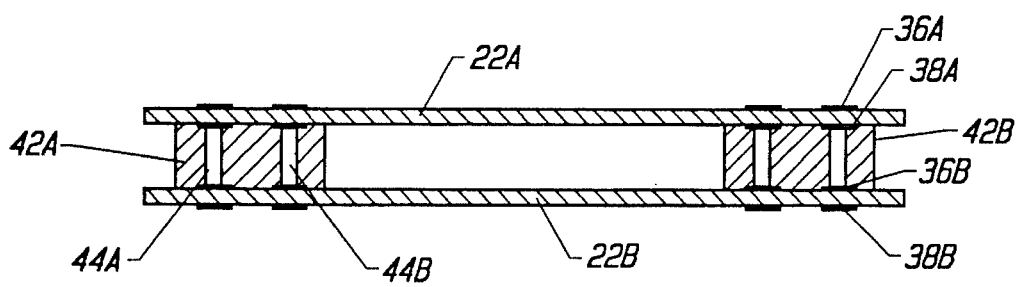
FIG. 5 is a cross-sectional view of a portion of the set of stacking connectors of FIG. 4, taken along the line 5—5.

FIG. 5 is a cross-sectional view of a first substrate-less multi-chip module 22A and a second substrate-less multi-chip module 22B separated by two stacking connector transverse members 42A, 42B. The stacking connector transverse members 42A, 42B are each formed of an insulating material and include connector vias 44. The connector vias 44 are attached to the bottom layer connecting pads 38 of the first substrate-less multi-chip module 22A and the top layer connecting pads 36 of the second substrate-less multi-chip module 22B. In a preferable embodiment, the connector vias 44, also referred to as contacts herein, are formed as wire springs. In this configuration, the springs provide pressure to insure good electrical contacts.

Figure 6:
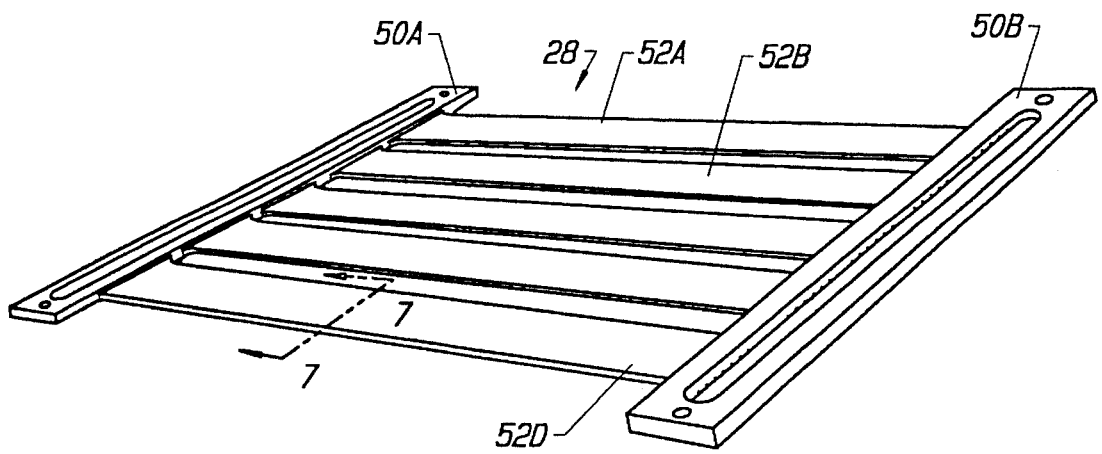
FIG. 6 is a perspective view of a heat exchanger in accordance with one embodiment of the invention.

FIG. 6 is a perspective view of a heat exchanger 28 that may be used in conjunction with the invention. The heat exchanger 28 includes two manifolds 50A, 50B with heat exchanger legs 52A–52D positioned therebetween.

Figure 7:
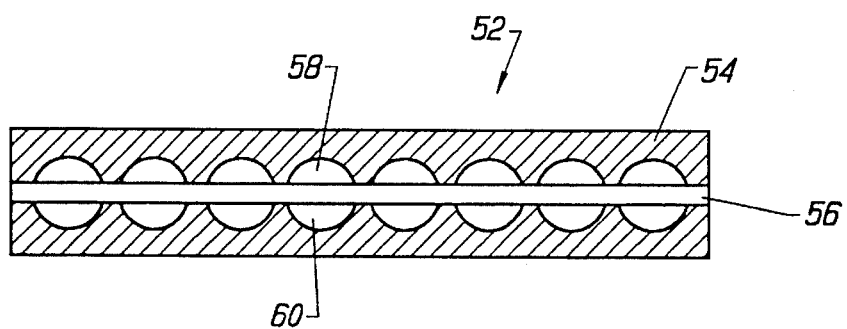
FIG. 7 is a cross-sectional view of a portion of the heat exchanger of FIG. 6, taken along the line 7—7.

FIG. 7 is a cross-sectional view of a portion of heat exchanger leg 52D of FIG. 6. FIG. 7 illustrates a heat exchanger body 54 with a septum 56 positioned therein. The heat exchanger body 54 includes a set of top flow channels 58 and bottom flow channels 60 which are used to circulate a cooling fluid. The heat exchanger 28 of FIGS. 6 and 7 is consistent with the heat exchanger of U.S. Pat. No. 5,079,619.

Figure 8:
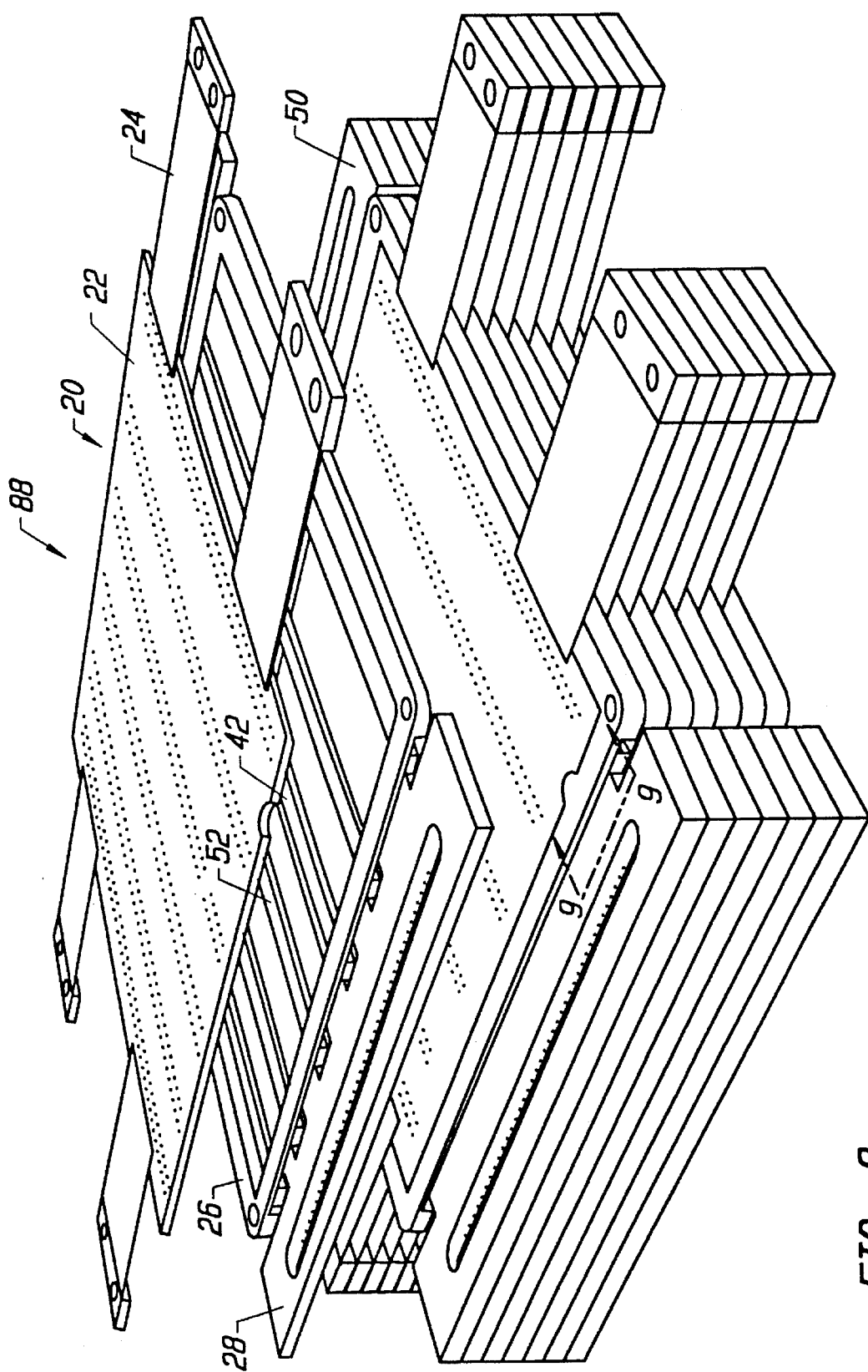
FIG. 8 is a perspective view of a partially constructed three-dimensional compact array of electronic circuitry in accordance with one embodiment of the invention.

FIG. 8 is a perspective view of a three-dimensional compact array of electronic circuitry 88 formed by using a set of modular arrays 20 of the type described in FIGS. 1–7. FIG. 8 particularly illustrates how the stacking connector transverse members 42 are interposed with the heat exchanger legs 52. From FIG. 8 it can be appreciated that the substrate-less multi-chip modules of the invention are positioned in direct contact with the heat exchanger legs 52 that circulate a cooling fluid. Consequently, there is very efficient heat transfer between the substrate-less multi-chip modules and heat exchangers. This topology is in contrast to prior art topologies which included a multi-chip module substrate between the multi-chip module and the heat exchanger.

Figure 9:
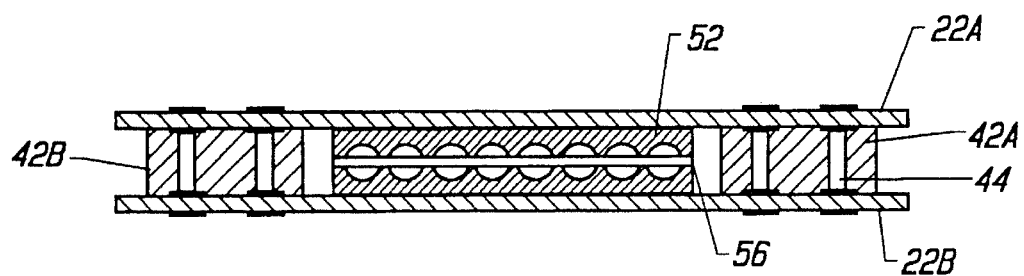
FIG. 9 is a cross-sectional view of a portion of the apparatus of FIG. 8, taken along the line 9—9.

FIG. 9 is a cross-sectional view of the apparatus of FIG. 8, taken along the line 9—9 in FIG. 8. The figure illustrates a heat exchanger leg 52 interposed between two stacking connector transverse members 42A, 42B. Connector vias 44 electrically connect a first substrate-less multi-chip module 22A to a second substrate-less multi-chip module 22B.

Figure 10:
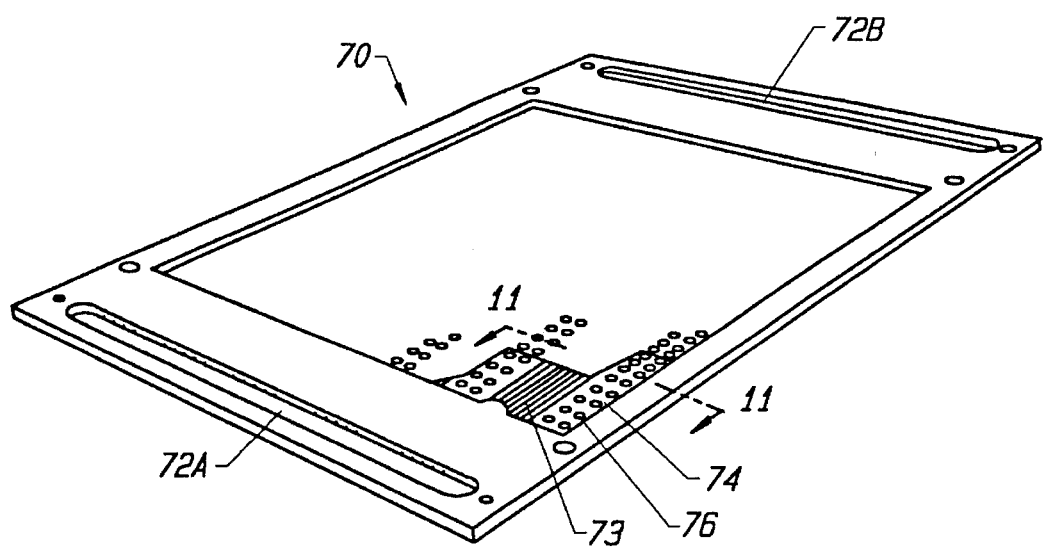
FIG. 10 is a perspective view of an integrated heat exchanger and stacking connector in accordance with one embodiment of the invention.

FIG. 10 is a perspective view of a preferable embodiment of the invention wherein the previously described discrete stacking connector 26 and heat exchanger 28 are formed as an integrated structure. The integrated heat exchanger and stacking connector 70 includes a transverse flow region 73 (corresponding to the heat exchanger legs 52) and a transverse via region 74 (corresponding to the stacking connector transverse members 42).

Figure 11:
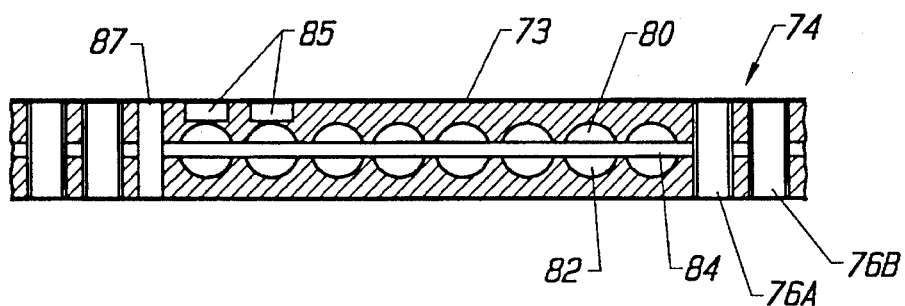
FIG. 11 is a cross-sectional view of a portion of the apparatus of FIG. 10, take along the line 11—11.

FIG. 11 is a cross-sectional view of a portion of the integrated heat exchanger and stacking connector 70 of FIG. 10. FIG. 11 illustrates top flow channels 80 separated from bottom flow channels 82 by a septum 84. The figure also illustrates connector vias 76A, 76B of the transverse via region 74. Known molding and milling techniques may be used to form the integrated heat exchanger and stacking connector 70.

FIG. 11 also illustrates that the integrated heat exchanger and stacking connector 70 may be formed with clearance regions 85 and holes 87. The clearance regions 85 and holes 87 are used to position surface mount components, such as capacitors, resistors, transistors, inductors, quartz crystals, etc, which may be required by the system, but are difficult to fabricate as a portion of the multi-chip module. The discrete stacking connector 26 and heat exchanger 28 may also be formed to include clearance regions 85 and holes 87.

Figure 12:
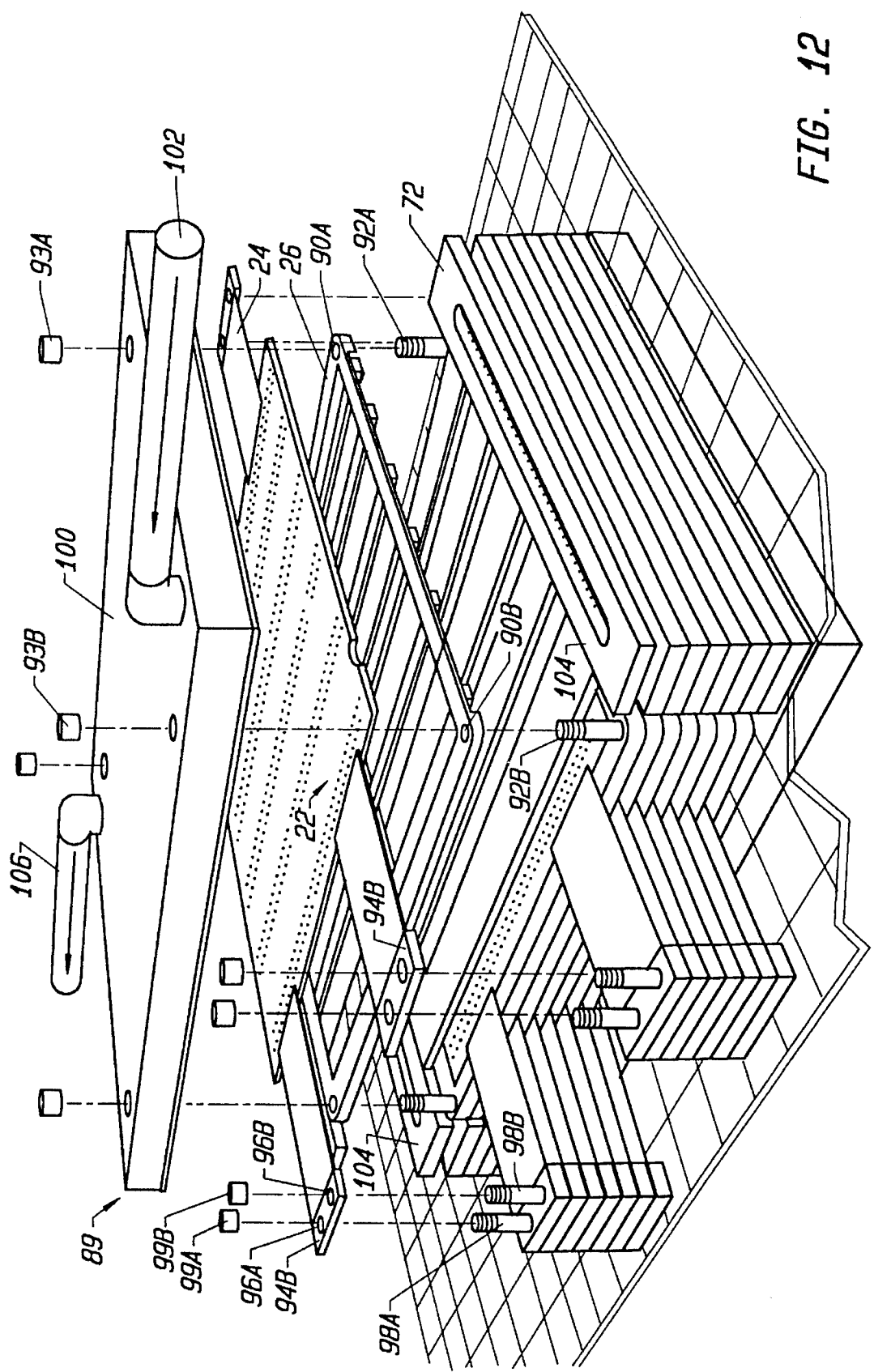
FIG. 12 is an exploded view of a constructed three-dimensional compact array of electronic circuitry in accordance with one embodiment of the invention.

FIG. 12 is a perspective view of a complete three-dimensional compact array of electronic circuitry 89 in accordance with one embodiment of the invention. The figure illustrates stacking connecting apertures 90 that are positioned through stacking connector mounting pins 92. Mounting nuts 93 are then used to secure the assembly. The figure also illustrates foil conductor terminators 94. Each terminator 94 includes a set of apertures 96A, 96B, which are positioned over mounting pins 98A, 98B. Nuts 99 are used to secure the terminators 94.

As shown in FIG. 12, an array lid 100 is used to cover the apparatus 89. The array lid 100 includes an input conduit 102 that delivers a cooling fluid to manifold feedthroughs 104. Similarly, manifold feedthroughs 104 are used to route cooling fluid to the output conduit.

Those skilled in the art will appreciate the numerous benefits associated with the apparatus and methodology of the invention. In the absence of a substrate, the modular compact array of electronic circuitry has a reduced volume.

Elimination of the substrate in an apparatus such as shown in U.S. Pat. No. 5,065,277 increases the vertical component density by a factor of approximately two. The apparatus of the invention is less expensive because a multi-chip module substrate is not required. For large substrates with many feedthroughs, the cost savings can be substantial. It is important to note that the apparatus of the invention has better heat transfer characteristics since the heat exchanger is positioned in direct contact with the substrate-less multi-chip module. As a result, the thermal resistance of the formerly used substrate and the thermal resistance of the joint between the substrate and heat exchanger is eliminated, thereby resulting in improved thermal performance.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

I claim:

1. A three-dimensional compact array of electronic circuitry, comprising:

a plurality of stacked modular compact arrays of electronic circuitry, each modular compact array of electronic circuitry including a multi-chip module including a plurality of integrated circuits and interconnect, which electrically connects said plurality of integrated circuits, embedded within a polymer insulator, and an integrated heat exchanger and stacking connector directly attached to said multi-chip module, said integrated heat exchanger and stacking connector including a transverse connector region including a plurality of connector vias for connection to said interconnect, and a transverse flow region including channels for circulating a coolant to remove heat from said multi-chip module.

2. The three-dimensional compact array of electronic circuitry of claim 1 wherein said plurality of stacked modular compact arrays of electronic circuitry are electrically interconnected by said transverse connector region of said modular compact arrays of electronic circuitry.

3. The three-dimensional compact array of electronic circuitry of claim 1 further comprising an array lid with an input conduit to deliver said coolant to said transverse flow region and an output conduit to route said coolant from said transverse flow region.

4. A modular compact array of electronic circuitry, comprising:

a multi-chip module including a polymer insulator with a top surface and a bottom surface, said polymer insulator embedding a plurality of integrated circuits and interconnect which electrically connects said plurality of integrated circuits, said interconnect including bottom connecting pads positioned on said bottom surface;

a stacking connector directly attached to said multi-chip module, said stacking connector including a stacking connector frame supporting a set of stacking connector transverse members, each of said stacking connector transverse members including a plurality of connectors connected to said connecting pads of said multi-chip module; and a heat exchanger cooperatively positioned with said stacking connector, said heat exchanger including a set of manifolds and heat exchanger legs positioned between said set of manifolds, said heat exchanger legs including channels for circulating a coolant, said heat exchanger legs being positioned between said stacking connector transverse members to remove heat from said multi-chip module.

5. The apparatus of claim 4 wherein said interconnect includes top connecting pads positioned on said top surface.

6. The apparatus of claim 5 further comprising a second stacking connector positioned on top of said multi-chip module and connected to said top connecting pads.

7. The apparatus of claim 6 further comprising a second heat exchanger cooperatively positioned with said second stacking connector.

8. The apparatus of claim 4 wherein said stacking connector and said heat exchanger are formed as an integrated structure.

* * * * *